United States Patent [19]

Godfrey et al.

[11] Patent Number: 4,718,858

[45] Date of Patent: Jan. 12, 1988

[54] MECHANICAL INTERCONNECT SYSTEM FOR ELECTRONIC UNITS ENCLOSED IN STACKABLE HOUSINGS

[75] Inventors: Richard J. Godfrey, Tustin; Ray N. Dushane, Fullerton, both of Calif.

[73] Assignee: Western Digital Corporation, Irvine, Calif.

[21] Appl. No.: 874,599

[22] Filed: Jun. 16, 1986

[51] Int. Cl.⁴ .......................................... H01R 13/629
[52] U.S. Cl. .................................... 439/296; 439/376
[58] Field of Search ............. 339/91 R, 75 R, 75 M, 339/34, 35, 47 R, 49 R; 439/296, 310, 342, 374, 376

[56] References Cited

U.S. PATENT DOCUMENTS

| | | | |
|---|---|---|---|
| 2,987,693 | 6/1961 | Wamsley | 339/91 R |
| 3,004,236 | 10/1961 | Dickenson et al. | 339/75 M |
| 3,345,604 | 10/1967 | Henschen et al. | 339/34 |
| 4,501,460 | 2/1985 | Sisler | 339/49 R |
| 4,558,914 | 12/1985 | Prager et al. | 339/49 R |

FOREIGN PATENT DOCUMENTS

2557346  6/1976  Fed. Rep. of Germany ... 339/75 M

*Primary Examiner*—John McQuade
*Attorney, Agent, or Firm*—Spensley Horn Jubas & Lubitz

[57] ABSTRACT

An inter-unit coupling mechanism is provided for coupling electronic units housed in separate enclosures both mechanically and electrically. A movable connector is electrically coupled to one of the units and engagable with a second connector coupled to the other unit. The movable connector is driven along a controlled path provided by a cam surface into straight engagement with the second connector. A lever arm provides a leverage advantage for forcing the two connectors together.

32 Claims, 12 Drawing Figures

MECHANICAL INTERCONNECT SYSTEM FOR ELECTRONIC UNITS ENCLOSED IN STACKABLE HOUSINGS

BACKGROUND OF THE INVENTION

1. Field of the Invention

The present invention relates to a system for interconnecting stackable housings containing electronic equipment and more specifically to an inter-unit coupling mechanism which joins individually housed computer units together both mechanically and electrically by actuation of a single actuator mechanism.

2. Prior Art

It has been common practice in the computer field to add peripheral equipment to a central computer in order to enhance the computer's operational features. For example, when additional storage is required, storage expansion units such as a disc drive, an optical storage drive, a tape drive, or additional RAM are connected to a peripheral expansion bus extending out of the computer unit's housing. The computer may then communicate with the added peripherals using a standard interface such as the SCSI (Small Computer Standard Interface) bus which has been proposed as a standard computer systems interface link for microcomputer systems.

Figure 1:
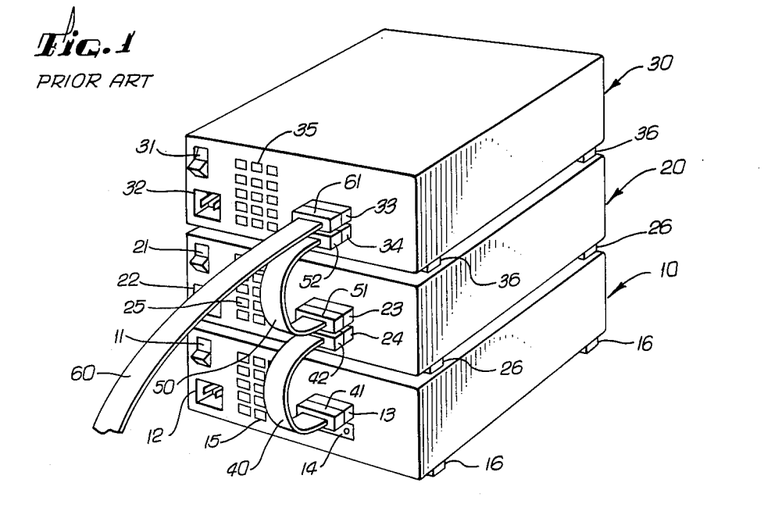
FIG. 1 is a perspective view of a conventional stacking arrangement.

Ribbon cables are generally connected by hand between each peripheral unit housing or box to form a daisy chained interface expansion bus such as shown in FIG. 1. The housings are typically stacked one above the other and then held in place while the interconnect cables are attached manually. One hand secures the uppermost housing while the other hand plugs the ribbon connector ends into their respective mating connectors on the housings. This manual interconnection method is adequate for situations where an expansion bus is formed only once and maintained as a permanent hardware extension at a single computer site. In large computing environments such as large offices where a plurality of central processing units are located at different sites it may be desirable to purchase only one storage expansion unit and utilize it on a shared basis by moving it from one central processing site to the next as needed. This will occur for instance when a local area network (LAN) linking the various central processing sites is not available. It will also occur in situations where the storage expansion unit is a high density device such as a 100 Mbyte optical storage drive whose use is optimized by connecting to a central processing unit using a short length cable capable of transferring data at high speed.

In these situations where a single expansion unit is shared by moving it from site to site, the expansion bus connectors are repeatedly connected and disconnected at each computer site. A reliable interconnection system is required in order to avoid system failure after each connect/disconnect operation.

Manual interconnection does not provide adequate safeguards because it gives the user unlimited freedom and thereby enables an unlimited number of failure modes. If for example, the connectors of the manual interconnect system are not fully mated when plugging one connector into another, one or more expansion bus lines may be left open thereby causing system failure. Untrained users often pull on the wires rather than the connector ends of an interconnect cable when unplugging one unit from another and this places excessive stress on the cable wires which then tend to break away from the connector pins inside the connector ends of the cables to create an intermittent open circuit which is difficult to diagnose. The manual interconnect method does not limit the length of cable used to connect one unit to the next. Long cables tend to generate undesirable EMI (electromagnetic interference) particularly when the cables in the conventional interconnect system are not properly shielded. Because the cables in the conventional system are detachable at both ends, special attention is required to make sure individual cables are not lost when peripheral units are rearranged (e.g., when transporting peripheral units to other computer sites).

The conventional arrangement shown in FIG. 1 is formed by placing one peripheral unit or box on top of the other and manually plugging interconnect cables in daisy chain fashion between the units. Each of the three boxes 10, 20, 30 shown in FIG. 1 includes an AC power switch 11, 21, 31 and a UL approved power connector 12, 22, 32 for safely providing high voltage AC power to the respective individual boxes 10, 20, 30.

Referring first to the base unit 10, a fifty pin SCSI bus connector 13 is fixed to the rear face of the base unit housing and a cover plate 14 is provided over an optional connector hole in the rear face of the housing. The rear face of the base unit housing also includes ventilation holes 15 for forced air cooling. A power supply housed inside the unit provides DC power to circuit boards inside the housing. Four rubber feet 16 support the base unit above a base surface such as a desk top and protect the base surface from scratching.

The second unit 20 rests above the base unit 10 on four rubber feet 26 and has a rear face plate identical to that of the base unit 10 with the addition of a second expansion bus connector 24 provided below the first expansion bus connector 23. Correspondingly numbered parts of the second unit 20 are identical to the parts already described with reference to the first unit 10 and their description is therefore omitted. Similarly, correspondingly numbered parts of the third unit 30 are identical and need not be described further.

An interconnect cable 40 provided with end connectors 41, 42 at opposed ends links the expansion bus connector 13 of the base unit to the expansion bus connector 24 of the second unit. The ends of the interconnect cable are manually plugged into respective mating connectors 13, 24 by "jiggling" the end connectors 41, 42 while applying a manual insertion force until the user feels that the end connectors are properly seated in their respective fixed connectors 13 and 24. Typically, an insertion force of at least twelve pounds is required for mating fifty pin connectors such as those used on the SCSI bus. This insertion force is even larger when the connectors are not accurately aligned. If the connectors are grossly misaligned and excessive force is applied, the connector pins will be damaged.

When the third unit is added to the stack, one hand holds the third unit 30 which is supported by four rubber feet 36 on top of the second peripheral unit 20 while the other hand is used to repeat the above plug-in procedure for the second and third units. End connectors 51, 52 of interconnect cable 50 are press fit into expansion bus connectors 23, 34, respectively, with the cable 50 then forming a loop extending outwardly from the rear of the stack. A third cable 60 links the daisy chain arrangement to a host computer through its end connector 61 which mates with fixed connector 33.

Disconnection is performed in a similar but reverse manner. One hand secures the topmost unit that is being removed from the stack while the other hand grasps the end connector and wiggles it out of the fixed connector on the unit housing. All too often the wire portion of the interconnect cable is pulled to unplug the end connector, placing excessive strain on the cable wires and potentially loosening them from their connection to the cable connector terminals thereby creating the intermittent open circuit discussed above.

In addition to the cables shown in FIG. 1, three AC power cords (not shown) extend from the rear power connectors 12, 22, 32 to a multiple outlet power strip (not shown). Space is therefore required beyond the rear face plates of the peripheral units for the numerous interconnect cables, power lines and the multiple outlet strip mentioned. This bundle of cables extending from the rear of the stack detracts from the stack's overall aesthetic appearance and uses space which could otherwise be available behind the stack.

The cable bundle extending from the rear surface of the stack also increases the danger of accidental damage to the peripheral units because one of the outwardly projecting cables at the rear of the stack can be snagged during routine maintenance, such as when cleaning the exterior surface of a unit. The snagged cable may pull the units to which it is connected off their resting positions on the stack and possibly damage connector pins in the process. From the above discussion it can be seen that this loose arrangement of units stacked one on top of the other with separate detachable cables extending from their rear surfaces suffers numerous drawbacks.

Incidentally, there is one more problem created by the interconnect system shown in FIG. 1 which is never considered until the stack is powered up and operating. A user wishing to add or remove a unit from the stack is confronted with three power switches, 11, 21, 31 and a bewildering number of choices. It is not clear to the user whether all the power switches should be shut off before adding a unit, only one switch should be shut off, the cable connectors should be mated/uncoupled first before turning power off, or the power should be shut off first before mating/uncoupling the connectors. Even experts can be baffled by the variety of choices.

SUMMARY OF THE INVENTION

It is an object of the present invention to overcome the above drawbacks by providing a mechanical interconnect system which replaces the manual interconnect method of the prior art. It is one object of the present invention to provide a mechanical interconnect system which electrically couples one expansion unit to another without using detachable cables. It is a second object of the present invention to provide an interconnect system which links stackable units both mechanically and electrically by operation of a single actuator. A third object is to provide an electrical interconnect system which supplies both expansion bus signals and electrical power to stackable units without requiring separate cables for the signals and power. It is another object of the present invention to provide means for connecting power lines and signal lines in a sequentially preferred order when making the electrical connection. Still another object of the present invention is to assure positive alignment between mating connectors without first jiggling the connectors to find a proper alignment position as is done in the manual method. Yet another object of the present invention is to provide a leverage mechanism which minimizes the amount of force required to mate one multi-pin connector with a second multi-pin connector.

According to the present invention, a multi-pin connector block comprised of an expansion bus connector and a power connector is supported movably at the rear side of a first unit housing by an inter-unit coupling mechanism. A flexible multi-wire cable couples the movable connector block electrically to the unit inside the first housing. The inter-unit coupling mechanism includes cam means for guiding the movable connector block along a controlled path into straight engagement with a complementary connector block located on a second unit housing. The movable connector block has a cam follower means which engages with the cam means and guides the movable connector block along the controlled path before it engages with its complementary connector block on the second unit housing. This controlled path provided by the mechanical interconnect system accurately aligns the movable connector block with its complementary connector block on the second unit housing before the two connectors are forced together to thereby overcome problems associated with the manual insertion method of the prior art.

In the preferred embodiment the movable connector block is mechanically supported between a pair of lever arms pivotally secured to the first unit housing and the lever arms are joined by an actuator handle whose actuation drives the movable connector block along a controlled path into mating engagement with a complementary connector block belonging to a second unit housing. The movable connector block is coupled electrically to the unit inside the first housing by means of a nondetachable flexible cable which is sheathed in a shielding sleeve to minimize electromagnetic interference (EMI). A pair of oval cam followers are fixed at the outer ends of the movable connector block. Guide grooves are formed in the sides of an interconnect channel formed at the rear of the first and second unit housings when the two are stacked for guiding the cam followers. The guiding grooves of the first unit housing guide the cam followers of the movable connector block during a first portion of a latching or actuating operation in which the actuator handle is operated to drive the movable connector block toward engagement with its complementary connector block on the second unit housing. The second unit housing also has guide grooves which unite with the guide grooves of the first unit to form a composite cam when the two units are stacked together. This composite cam has surfaces which guide the cam followers along a controlled path that includes a linear track at a position just before the movable connector block mates with its complementary connector block. The linear track guides the movable connector block straight into its complementary connector on the second unit housing.

The inter-coupling mechanism of the preferred embodiment also includes positioning means for positioning the movable connector relative to its complementary connector after the two are mated to thereby insure that the movable connector is joined to its complementary connector by a joining force which is neither excessively above nor below an amount necessary for reliable electrical contact.

Problems associated with jiggling and misalignment are eliminated by the linear track which accurately guides the mating connectors during connection and disconnection. Loose connections and connections made with excessive force in the manual insertion method of the prior art are eliminated by the mechanical positioning means of the present invention which controls the joining force holding the two connectors together after they are mated. Problems associated with the manual connection method of the prior art are therefore eliminated.

The movable connector block is supported by the lever arms at a position in between the operating ends of the lever arms (the actuator handle ends) and their pivot ends. This positioning provides a leverage advantage which reduces the amount of operating force required when actuating the actuator handle to mate the two connector blocks together. The lever arms include a pair of latching pins which engage with locking grooves on a second housing unit to mechanically lock the first and second housing units together by the same actuating action which electrically mates the movable connector to its complementary connector on the second housing unit. Connector pins formed in the movable connector block and connector sockets formed in its complementary connector block are respectively staggered in the mating direction to provide a preferred connecting sequence in which some connector pins and sockets make electrical contact before others.

The composite cam described above also includes a rounded portion along which the oval cam followers slide. The rounded portion causes the cam followers to rotate by 180 degrees thereby rotating the movable connector block by 180 degrees as it moves from an unlatched position in which it faces outwardly from the first housing unit to a latched position in which it faces inwardly to mate with the complementary connector of the second housing unit. In its unlatched position, the outwardly facing movable connector block is available for conventional mating with external cables.

The linear track portion of the composite cam transforms the rotary motion used to actuate the lever arms which are pivotally secured to the first housing into a linear motion which guides the movable connector straight into its complementary connector on the second housing unit. After the movable connector block is mated with its complementary connector block, the lever arms are retained in a latched position by a locking groove which includes a retaining portion for retaining the lever arms at the latched position. Concomitant with the leverage advantage provided by the midway positioning of the movable connector block between the operating ends of the lever arms and their pivot points, a positioning advantage is also obtained for holding the movable connector block in pressed engagement with its complementary connector block because any movement near the operating ends of the lever arms, at a position where the lever arms are held by the retaining portion, is geometrically reduced when transmitted to the point where the lever arms support the movable connector block.

DETAILED DESCRIPTION OF THE PREFERRED EMBODIMENTS

Figure 2:
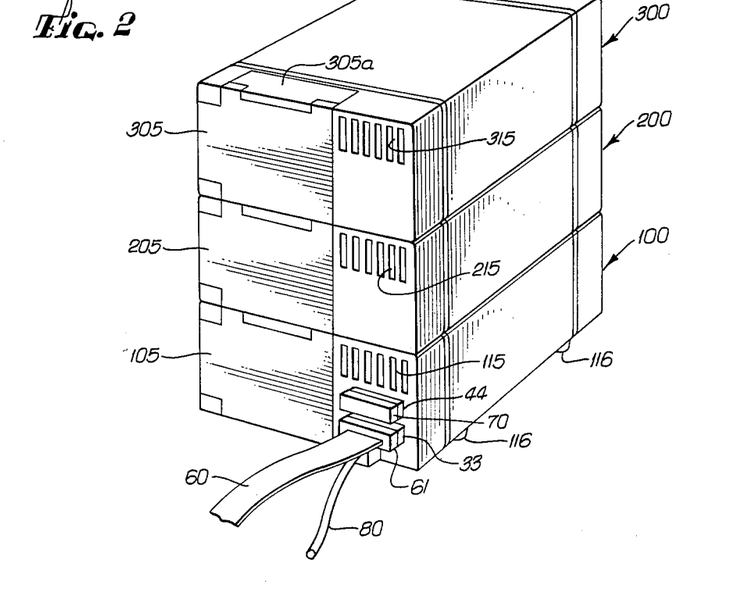
FIG. 2 is a perspective view of a stacking arrangement according to the present invention.

FIG. 2 is a perspective diagram illustrating a first box or enclosure 100 housing a peripheral unit (not shown), on top of which there are stacked a second and third box 200 and 300. Each of the upper housings 200, 300 is stacked flush to the housing below. The first box 100 serves as a base unit supplying expansion bus signals and electrical power to the upper units. A power cord 80 supplies high voltage AC power to the entire stack through an AC connector 12 (shown in FIG. 8) provided at the back of the base unit. A SCSI bus connector 33 couples the base unit to a host computer via cable 60. A second SCSI connector 44 is provided above connector 33 for daisy chaining the stack to additional SCSI devices. A bus terminator 70 comprised of a plurality of resistive elements is shown in FIG. 2 plugged into the second SCSI connector 44. The resistive elements of the terminator 70 are matched to the line impedances of the SCSI bus and provide an appropriate termination to the lines when the stack is not daisy chained to additional units.

As seen in FIG. 2, there are no cables projecting outwardly from the rear surface of the stack except for cables 60 and 80 extending from the lowermost unit. Interconnections between stack units 100, 200, 300 are made behind rear panel doors 105, 205 and 305 which close flush with the rear faces of their respective units. A top panel door 305a hinged to rear panel door 305 is shown in FIG. 2 closed flush with the top surface of the uppermost box 300. This top panel door 305a covers the top of a vertical interconnect channel or conduit formed when the units are stacked one on top of the other. The interconnect channel will be described shortly.

Identical parts of stack units 100, 200 and 300 are referenced herein by numerals which differ only in the most significant digit, that digit indicating a specific stack unit. Descriptions made with respect to a part on one stack unit apply equally to correspondingly numbered parts on the other stack units unless otherwise stated. The housings of the stack units are generally identical at their top, bottom and rear faces. The front face of each unit may differ however depending on the device housed inside which could be a single floppy disk drive, a dual disk drive, a magnetic cartridge, etc.

Referring still to FIG. 2, a plurality of ventilation exhaust holes 115, 215 and 315 are respectively provided on the rear faces of the stack units. The base unit has a plurality of ventilation intake holes 117 formed on its bottom face 100b (shown in FIG. 10) through which ventilating air is force fed into the base unit by means of an internal fan or through simple convection. A plurality of rubber feet 116 support the base unit above a base surface to provide space for ventilation intake and also to prevent damage to the base surface which could be a desk top or table in an office environment. Additional ventilation intake holes are provided on the front faces of the upper stack units (not shown). Hot air is vented out through the ventilation exhaust holes 115, 215 and 315 at the rear of the stack.

Figure 3:
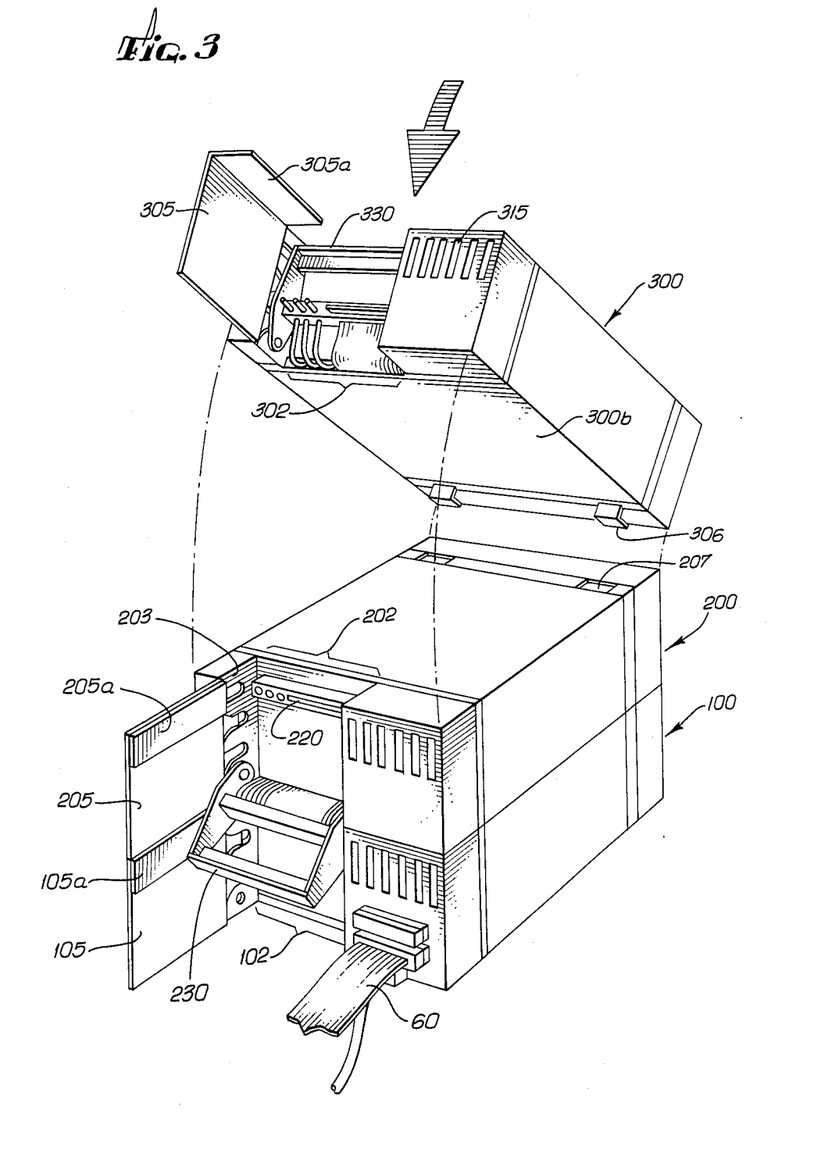
FIG. 3 is a perspective view illustrating the stacking operation according to the present invention.

Referring now to FIG. 3, the stack is shown with the uppermost unit 300 partially removed and the rear panel doors 105, 205 and 305 opened to expose a vertical stack channel formed by C-shaped recesses 102, 202, 302 provided in the rear portions of the respective housings 100, 200 and 300. A leverage handle 230 pivotally fastened to its respective housing 200 is shown at a partially operated position in which it projects out of the stack channel to expose cam face or a side rail 203 having three cam grooves formed therein.

Figure 4A:
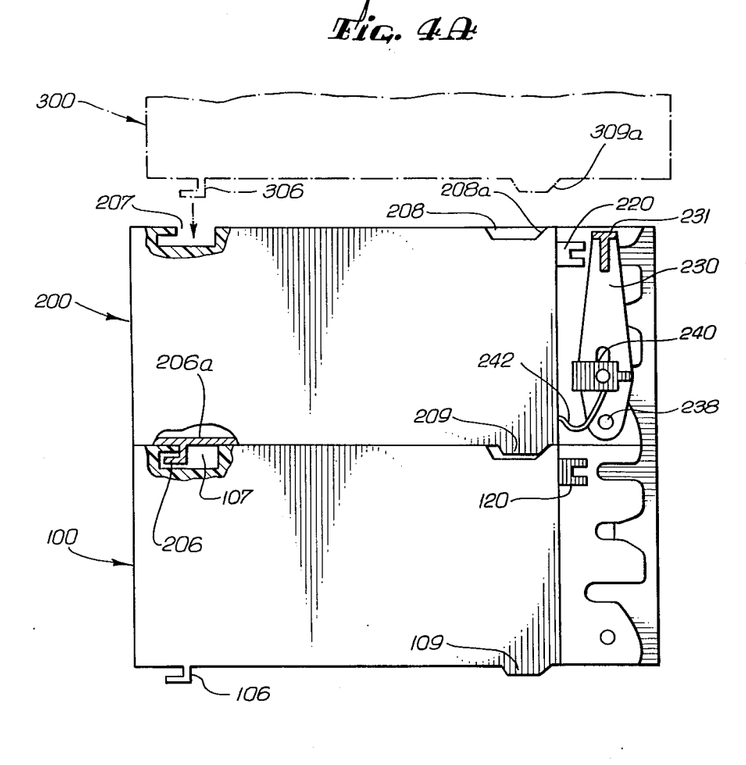
FIG. 4a is a sectional view showing one unit stacked on a second unit before electrical connection is made.

The front portions of the stack units 100, 200, 300 are secured together by means of L-shaped front feet 206, 306 (see also FIG. 4A) which slide forward into top securing holes 107, 207 of the unit below. The securing holes are boot shaped as shown in FIG. 4A. Once the front feet have been slid forward in their respective securing holes, the front portion of an upper unit can not be lifted vertically away from the unit below.

Figure 7:
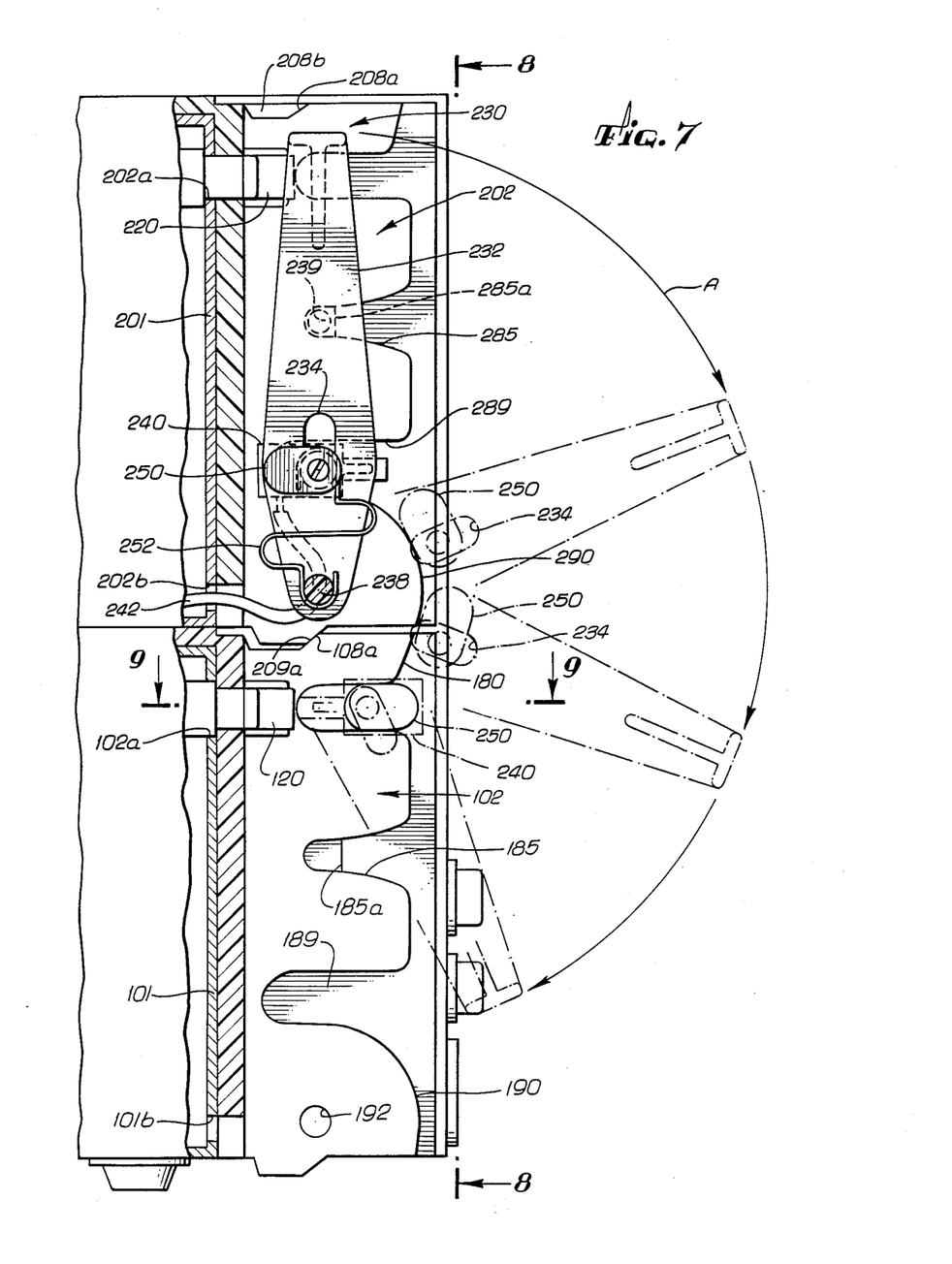
FIG. 7 is a sectional view illustrating the latching operation of the present invention.

The rear portions of the stack units are mechanically secured together by operating the actuator handles 231, 331 of leverage handles 230 and 330 in the upper units as indicated in FIG. 7. The base unit 100 is not connected to a lower unit and therefore does not have a leverage handle. Each leverage handle 230, 330 is pivotally fastened to its respective unit 200, 300 and operates to connect its respective box to the unit below both electrically and mechanically with a single actuation motion.

Figure 6:
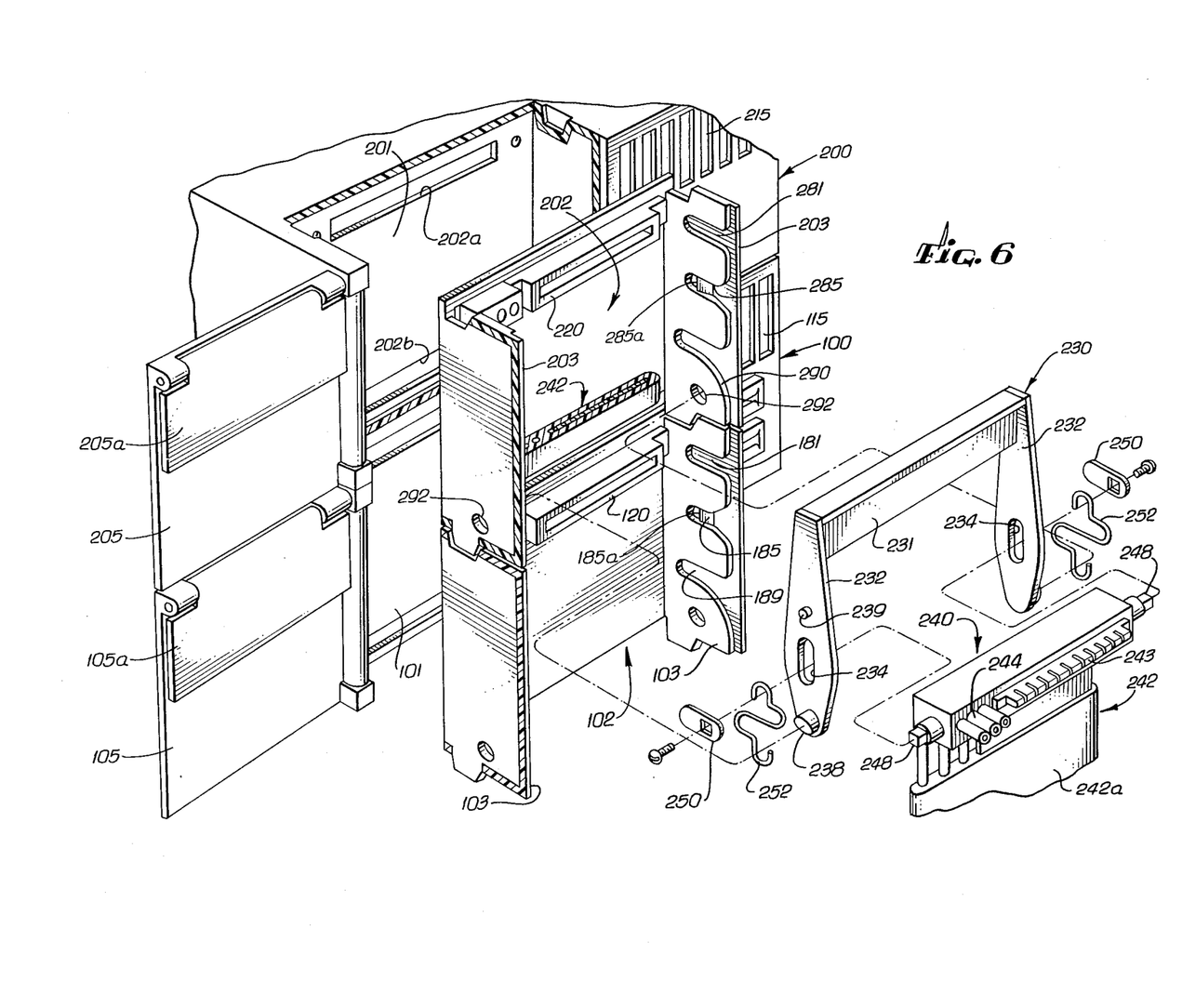
FIG. 6 is an exploded perspective view of the cam mechanism according to the present invention.

FIG. 6 provides a perspective view of the interconnect system at the rear portion of the units. Portions of two rear bezels covering respectively the rear portions of units 100, 200 are broken out for clarity in FIG. 6 to expose metal chassis 101 and 201. The rear bezels are molded entirely out of plastic and fitted over an EMI shielding enclosure such as metal chassis 101 and 201. The metal chassis and rear bezels are formed with C-shaped recess portions 102, 202 which align to create a vertical interconnect channel or conduit when the units are stacked together. A fixed connector block 120 is wired to the interior of unit housing 100 and projects through a connector block hole 102a formed in the back of the conduit recess 102 to connect the enclosed base unit to the unit enclosed in the upper housing 200 via the vertical interconnect channel. Expansion bus signals and DC power are supplied to the upper stack units from the base unit interior by means of this fixed connector block 120. Guiding grooves 181, 185, 189 (to be described later) are formed of molded plastic on the side faces or side rails 103 of the recess as shown in FIG. 6.

The second recess portion 202 in the second box 200 is formed identical to the base unit recess 102. A leverage handle 230, shown in its upright or unlatched position in FIG. 6, is pivotally mounted into the chassis recess 202 by means of pivot posts 238 which snap resiliently into pivot holes 292 provided in the side rails 203. The pivot posts are formed integrally at the pivot ends of a pair of lever arms 232 and their distal ends are beveled for easy snap-in insertion into the pivot holes. The leverage handle supports a movable connector block 240 between its lever arms 232. The movable connector block 240 is elongated and has a pair of oval shaped cam followers 250 eccentrically fixed to the outer ends 248 of its longitudinal axis through slotted holes 234 provided in the lever arms 232. The outer ends 248 of the movable connector block have rounded neck portions from which a square shank extends to secure the cam followers 250. The rounded neck portions of the movable connector block allow it to pivot about its longitudinal axis so that it can rotate to face outwardly from unit 200 and inwardly toward unit 100 respectively in the unlatched and latched positions of the leverage handle latching operation.

When the leverage handle 230 is driven about its pivot posts 238, the oval cam followers 250 slide along rounded cam portions 290 provided in the lower half of side rails 203 of the chassis recess 202. The movable connector block 240 to which the cam followers 250 are fixed rotates about its longitudinal axis as the cam followers 250 move downwardly against the rounded cam portion 290 as shown in FIG. 7. A pair of S-shaped springs 252 clamped between the necks of the outer ends 248 and the pivot posts 238, urge the cam followers 250 against the cam surface of the rounded cam portions 290. The rounded cam portions 290 are eccentric with respect to pivot holes 292 causing the springs 252 to continuously expand while the cam followers move downwardly around the rounded portions 290 and this continuous expansion of the springs results in accumulation of a positive actuation energy which is used during the last portion of the latching operation.

The springs 252 are designed to produce an urging force which overcomes the resiliency of a flexible ribbon cable 242 extending from the movable connector block 240. This force accumulates during the first part of the latching operation due to the eccentric shape of rounded cam portions 290 described above. The springs have a serpentine shape which minimizes stress during their operation and thereby increases their service life.

Figure 5A:
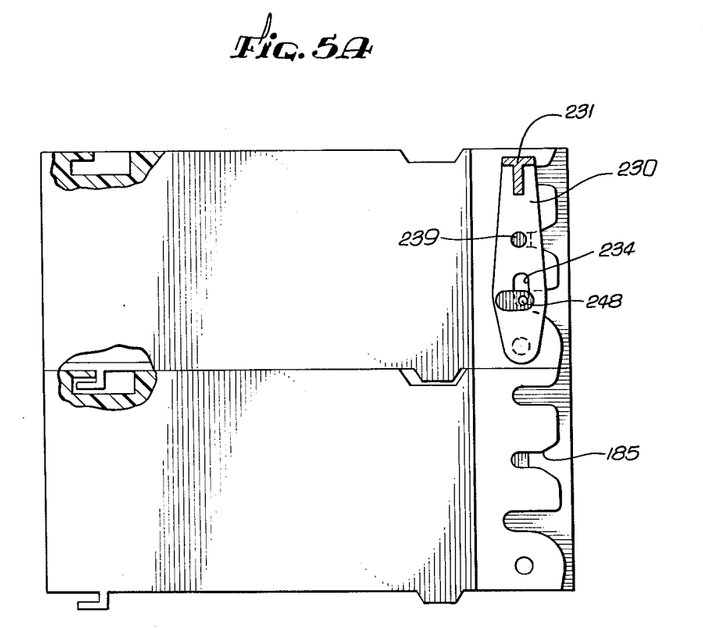
FIGS. 5a and 5b are sectional views illustrating the mechanical latching operation of the embodiment shown in FIGS. 4a and 4b.
Figure 5B:
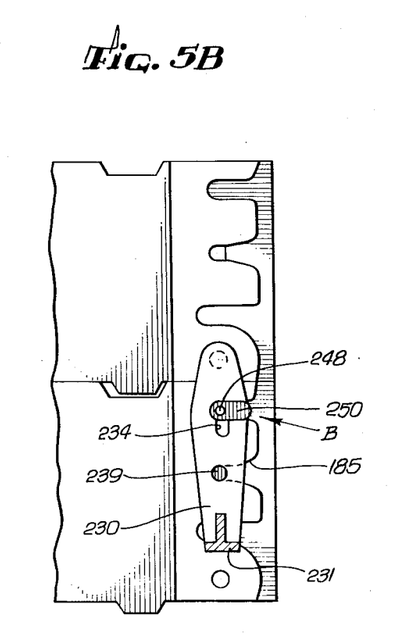

The rounded cam portions 290 of the upper unit join with upper cam portions 180 provided on the opposed side rails 103 of the lower unit to form continuous cam surfaces (composite cams) along which the cam followers 250 are guided. The upper cam portion 180 guides its respective cam follower 250 to the full engagement or latching position B when the leverage handle 230 is swung to its lowermost position as shown in FIG. 5B.

The upper cam portion 180 has a hump 180a around which the cam followers quickly swing into alignment with a linear guiding groove (linear track) 181 due to the actuation energy accumulated by the serpentine springs 252 during the first part of the leverage handle latching operation in which they were expanded by means of the eccentric cam portion 290. The accumulated spring force overcomes any resistance offered by the flexible ribbon cable 242 extending out of the movable connector block and the accumulated force also gives the leverage handle a positive actuation feel during the latter portion of the latching operation. The cam followers 250 enter the linear guiding groove 181 during the last portion of the downward swing of leverage handle 230. The linear guiding groove aligns the movable connector which is angularly fixed to the cam followers 250 straight into the fixed connector 120 as indicated by direction arrow C in FIG. 4B without any misalignment or jiggling. The service life of both connectors is therefore improved.

Figure 4B:
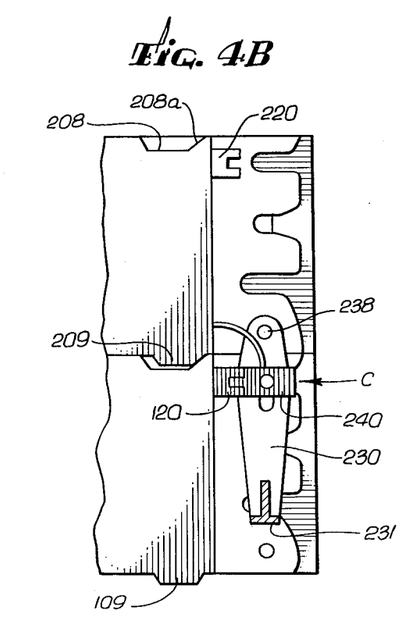
FIG. 4b is a partial sectional view of the apparatus of FIG. 4a after electrical connection is made.

Referring to FIGS. 4A and 4B, the movable connector block 240 is positioned between an actuator handle or cross bar 231 at the operating end of the leverage handle and the pivot posts 238 at the pivot end of the leverage handle. This positioning arrangement in which the distance between the connector block and pivot points is shorter than the distance between the operating end and the pivot points, creates a leverage advantage which reduces the operating force required to drive the leverage handle 230 as compared to the force required for mating the movable connector block 240 into engagement with the fixed connector block 120 by the manual insertion method of the prior art. Preferably the movable connector block is located approximately three-fourths of the way down from the operating end of the leverage handle to create a 4:1 leverage advantage. The fifty pin connectors used for the SCSI bus interconnections normally require 12-16 pounds of insertion force for mating. The leverage arrangement of the present invention on the other hand requires less than 4 pounds of driving force applied to the actuator handle 231.

A flexible ribbon cable 242 extends from the movable connector block 240 into the peripheral box 200 through a hole 202b provided in the housing of box 200. The wires of this cable electrically connect the movable connector block 240 to the peripheral unit housed inside the unit housing 200 and also to a fixed connector block 220 projecting through the top hole 202a of chassis recess 202. The stack unit housings 100 and 200 are made of a sheet metal frames 101, 201 which shield the enclosed peripheral units electrically from the external environment. An enclosure made of a plastic sheet covered with a metalic film or paint can be used in place of the sheet metal frame 101, 201 for reducing EMI. The flexible cable 242 is enclosed in a grounding sleeve 242a extending through a second hole 202b into the interior of the metal housing. The sleeve is electrically connected to the metal housing to shield against EMI from the ribbon cable.

When the movable connector block 240 mates with the fixed connector block 120 of the lower box 100, a daisy chain connection is made between the fixed connector block 120 of the base unit and the fixed connector block 220 of the second unit through the interior of the second unit. It should be apparent now that additional boxes 300, 400, etc. may be stacked on top of box 200, each of the upper boxes being electrically connected to the box below without using detachable cables in the same fashion that box 200 is connected to box 100.

In addition to providing electrical interconnection between stacked boxes without using detachable cables, the present invention simultaneously locks each box mechanically to the one below when the cam followers (i.e. 250) slide into the linear guiding grooves (i.e. 181) of the unit below. When the cam followers ride around rounded cam portion 290, the movable connector block 240 is forced away radially from the pivot posts 238 by the eccentric shape of the rounded portion 290 and its outer ends 248 slide toward the radially distal ends of slotted holes 234 formed in the lever arms 232. As seen in FIG. 5B the outer ends 248 of the connector block will abut against the radially distal ends of the slotted holes 234 if an attempt is made to mechanically separate the upper and lower stack units in the vertical direction at their rear portions. Preferably, a pair of latching pins 239 are provided on the arms 232 of the leverage handle 230 to strengthen the mechanical link between the two units. The latching pins 239 slide into a funnel shaped locking groove 185 in the lower unit recess 102 when the leverage handle 230 is swung to its lowermost position as shown in FIG. 5B. The locking groove 185 has a retaining ridge 185 a formed across its mouth as does groove 285 on the upper unit. The sides of the funnel shaped grooves 185 and 285 (upper unit) are arched to correspond with the arc shaped path of pins 239 during the latching/unlatching operation. The side rails 203 and lever arms 232 flex a little to let the latching pins 239 ride past retaining ridges 185a formed on both side rails. The ridges 185a on the lower unit and 285a on the upper unit respectively retain the leverage handle in its latched and unlatched positions.

Referring back to FIG. 4A, the top portion of unit 200 includes a stacking notch 208 provided with an inclined back surface 208a. The notch also has inclined side faces (not shown). A corresponding projection or stacking foot 309 is provided on the bottom portion of unit 300 and includes an inclined back surface 309a which slides against the inclined back surface 208a when unit 300 is placed on the stack as shown in FIG. 4A. This sliding action of inclined surfaces 208a and 309a forces front foot 306 forward in hole 207 to align the units in the horizontal direction. The inclined side faces of the notch register the upper unit 300 into alignment with the lower unit 200 in the sideways direction. This horizontal aligning mechanism is preferably incorporated into the structure of the side rails 103, 203 as indicated in FIG. 7 by inclined surfaces 108a and 209a. The inclines 209a of stacking feet 209 engage and slide down on inclined surfaces 108 a of stacking notches 108 to horizontally position the units 100, 200 when the units are vertically stacked. The side faces 208b of the opposing notches 208 on side rails 203 are opposingly inclined to provide sideways registration of the units during stacking.

Figure 8:
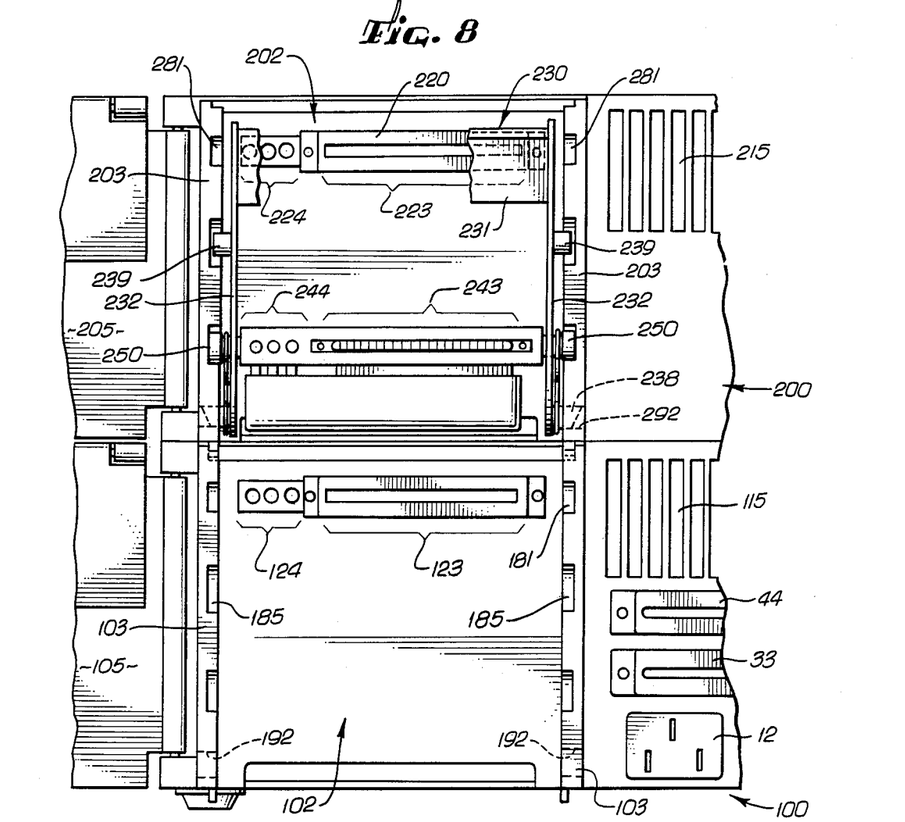
FIG. 8 is a partial plan view of the rear portion of a stack according to the present invention.

FIG. 7 illustrates the composite cam structure formed when side rail 203 is stacked to the top edge of side rail 103. As seen in FIG. 7, the rounded cam portion 290 is continuous with the upper cam portion 180 of the unit below thereby forming a composite cam surface along which the cam followers ride. Cam follower 250 is shown seated in notch 289 when the leverage handle is in its uppermost position. Dashed line A indicates the path travelled by the leverage handle 230 when it is swung from its uppermost (unlatched) position to its lowermost (latched) position. Each cam follower 250 rotates one hundred eighty degrees when it is moved from notch 289 to the linear guiding groove 181. Movable connector block 240, to which the cam followers 250 are fixed at opposed ends, also rotates 180 degrees. When leverage handle 230 is in the unlatched state (uppermost position), a plurality of signal pins 243 and power pins 244 project outwardly from connector block 240 (as shown in FIG. 6 and FIG. 8) thereby providing access to the expansion bus by means of a conventional loose cable with a female connector at its end.

Figure 9:
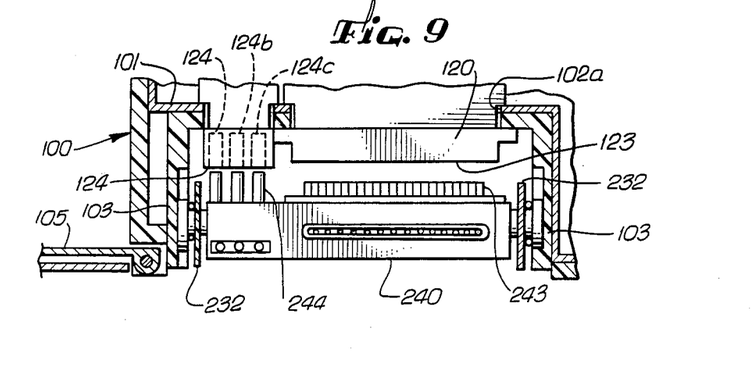
FIG. 9 is a sectional top view illustrating the sequential electrical connecting action of the preferred embodiment.

In the latched state, pins 243, 244 are rotated 180 degrees to face inwardly toward the fixed connector block 120 of the unit below as shown in FIG. 9. The linear groove 181 guides the movable block pins 243, 244 straight into the sockets 123, 124 of the fixed connector block 120. It should be noted that access to the sockets of the fixed connector block 220 is blocked by cross bar 231 in the unlatched state for safety reasons (See FIGS. 4A and 4B). The fixed connector block 220 becomes accessible only when the leverage handle 230 is brought about to its latched state (See FIG. 4B).

The base unit 100 includes a DC power supply for providing +5 VDC, +12 VDC and Ground (GND) to units stacked above it through three power sockets 124a, 124b, 124c. The power sockets 124 a-c are staggered in the mating direction ahead of the SCSI bus signal sockets 123. In FIG. 9 it can be seen that the complementary power pins 244 project further out than the signal pins 243 from connector block 240. This staggered arrangement assures that power will be applied to the upper unit through the power pins 244 before any of the signal pins 242 mate with the signal sockets 123 on the lower unit. Accordingly, power-up initialization of the signal lines 243 on the upper unit may take place before the signal lines are connected to the SCSI bus lines. The uppermost stack unit can therefore be connected to the SCSI bus without shutting off the lower units or halting communication between the lower units already coupled to the SCSI bus.

Units mounted on top of the base unit 100 do not require individual power supplies because they draw their required power from the three DC power supply lines 124 a,b,c. The upper units may therefore be manufactured with less weight, cost and reduced heat dissipation requirements. Also the upper units no longer need individual power switches because the movable power pins now provide the power on/power off function. In the prefered embodiment however, on/off switches are provided on the front bezels (faces) of each unit to let a user shut down any individual unit if so desired.

Figure 10:
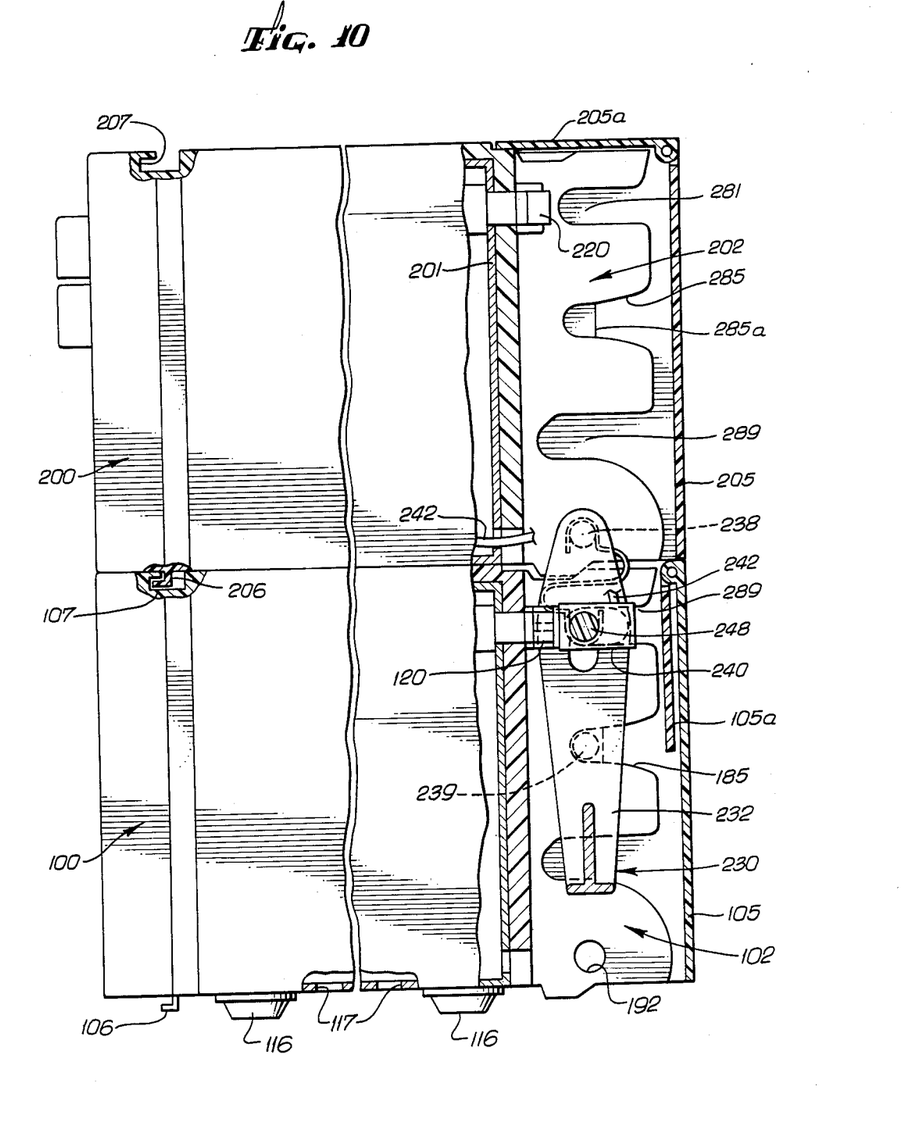
FIG. 10 is a sectional side view of a stacked arrangement according to the present invention.

The base unit is raised above the floor surface by a plurality of feet 116 (FIG. 10). Ventilation intake holes 117 are provided on the bottom surface of the base unit for cooling the internal power supply. A fan provided in the base unit can force feed ventilating air through the ventilation intake holes 117 and hot air is vented out through holes 115 on the rear face.

It should be apparent now from the description of the preferred embodiment that the present invention provides an interconnect system which provides electrical interconnection without detachable cables and in which the housings of peripheral units are mechanically secured together to form a stack by the same motion which mates a movable connector of one unit to a second connector of a second unit. While the second connector of the preferred embodiment is fixed, it is within the scope of the present invention to use a second connector which is not fixed to the second housing and to provide a composite guide means such as complementary cam followers and grooves formed on first and second movable connectors respectively belonging to first and second housing units where the followers and grooves engage when the first and second movable connectors approach each other for guiding one movable connector straight into the other. Other embodiments as may occur to those skilled in the art are also within the scope of the following claims.

We claim:

1. An inter-unit coupling mechanism for coupling a first electronic unit housed in a first enclosure to a second electronic unit housed in a second enclosure comprising:
   a first connector that is movable externally of the first enclosure from a first predetermined position which is fixed relative to the first enclosure to a second predetermined position which is also fixed relative to the first enclosure;
   a second connector engageable with the first connector and fastened to the second electronic unit;
   communicating means for coupling the first connector to the first electronic unit housed in the first enclosure; and
   guide means for guiding the first connector along a predetermined controlled path into engagement with the second connector when the first and second enclosures are aligned in a predetermined relationship, wherein the controlled path links the first enclosure to the second enclosure in a substantially complete manner and wherein the controlled path includes the first and second positions.

2. An inter-unit coupling mechanism according to claim 1 wherein;
   said guide means includes lever means operatively coupled to said first connector for driving said first connector along said controlled path.

3. An inter-unit coupling mechanism according to claim 2 wherein said lever means comprises a pair of lever arms pivotally secured to said first enclosure at respective pivoting ends of said lever arms, said lever arms having respective operating ends located a first distance away from said pivoting ends, said lever arms supporting said first connector a second distance away from said pivoting ends, where said second distance is shorter than said first distance thereby providing a leverage advantage for driving said first connector with a driving force applied to said operating ends of said lever arms.

4. An inter-unit coupling mechanism according to claim 2 wherein said lever means includes latching means for fixedly securing said first enclosure to said second enclosure.

5. An inter-unit coupling mechanism according to claim 2 wherein said guide means comprises a cam face having a first cam surface including a linear portion for guiding said first connector into straight engagement with said second connector; and
   said first connector has cam follower means engagable with said first cam surface for guiding said first connector into straight engagement with said second connector.

6. An inter-unit coupling mechanism according to claim 2 wherein said guide means comprises retaining means for retaining said first connector at a pre-established position relative to said second connector when the two connectors are operatively engaged.

7. An inter-unit coupling mechanism according to claim 1 wherein said communication means comprises a flexible ribbon cable.

8. An inter-unit coupling mechanism according to claim 1 further comprising stacking means for stacking said first enclosure generally flush with said second enclosure and for aligning said enclosures in said predetermined relationship.

9. An inter-unit coupling mechanism according to claim 8 wherein said first and second enclosures have respective first and second recess portions formed on their exteriors to form a stack channel when said first and second enclosures are stacked and aligned in said predetermined relationship; and
   said communication means communicates between the interior and exterior of said first enclosure through a hole formed in said first recessed portion, and said communication means is retractable into either of said first and second recessed portions such that it does not extend outside of said first and second recessed portions.

10. An electronic unit capable of interconnecting with a similar electronic unit aligned at a predetermined position below it, said lower electronic unit having at least a lower unit housing and a lower connector fastened to the lower electronic unit, the upper electronic unit comprising:
   an upper unit housing enclosing an electronic circuit;
   an upper connector located outside of said upper unit housing, electrically communicating with the electronic circuit of said upper unit housing, movable relative to said upper unit housing, and engageable with said lower connector of said lower electronic unit; and
   latching means for fixedly securing said upper unit housing to said lower unit housing, said latching means including an actuator which is operated to secure the two unit housings together;
   wherein said upper connector is coupled to said latching means and movable by said latching means such that said upper connector will engage electrically with said lower connector of said lower electronic unit when said actuator is operated to secure the two unit housings together.

11. An electronic unit as defined in claim 10, wherein said latching means includes an L-shaped foot for securing said upper electronic unit to said lower electronic unit.

12. An electronic unit as defined in claim 10 further comprising:
   communication means communicating between said upper connector and the interior of said upper unit housing for transmitting signals therebetween, said communication means including flexible cable means including a ribbon cable for transmitting expansion bus signals and a power line for transmitting electrical power between the interior of said upper unit housing and said upper connector.

13. An electronic unit as defined in claim 10;
   wherein said upper connector includes a first power contact for providing a power supply interconnection between the upper unit housing and the lower unit housing and a first signal contact for providing a data signal interconnection between the upper and lower unit huosings, wherein said lower connector includes complementary second power and signal contacts, and wherein the power and signal contact pairs are staggered with respect to one another such that interconnection between the power contacts and interconnection between the signal contacts will be made or broken sequentially in a predetermined order when the upper connector is moved by said latching means to operatively engage or disengage with said lower connector thereby providing for a predetermined power-up or power-down sequencing of the power and signal interconnections when the upper connector is engaged or disengaged with the lower connector.

14. An electronic unit as defined in claim 10;
   wherein said latching means includes a lever arm pivotally mounted to a pivot point on said upper unit housing, said lever arm being coupled to said upper connector to drive said upper connector into engagement with said lower connector, said lever arm having an operating end located a first distance away from said pivot point and a coupling point at which it couples with said upper connector located a second distance away from said pivot point, wherein said first distance is greater than said second distance thereby providing a leverage advantage for moving said upper connector when a driving force is applied to said operating end.

15. An electronic unit defined in claim 14;
   wherein said upper connector is rotatably supported by said lever arm and said upper connector includes cam follower means for controlling the rotation of said upper connector; and
   said upper unit housing includes cam means engagable by said cam follower means, said cam means comprising a rounded portion for rotating said upper connector when said lever arm is operated.

16. An electronic unit defined in claim 15;
   wherein said lever arm supports said upper connector by means of a slotted hole formed through said lever arm such that said upper connector can reciprocate toward and away from said pivot point;
   said rounded portion is eccentric with respect to said pivot point such that said upper connector reciprocates away from said pivot point during a first portion of a pivoting motion of said lever arm and moves toward said pivot point during a second portion of said pivoting motion of said lever arm;
   said latching means further comprising energy accumulating means for storing energy derived from operation of said lever arm during said first portion of the lever arms motion and imparting the stored energy to said lever arm during said second portion of the lever arm motion thereby creating a positive actuation force during said second portion of the lever arm motion.

17. A multi-unit interconnection arrangement for connecting a first electronic unit to a second electronic unit, comprising:
   a first unit housing enclosing said first electronic unit;
   a second unit housing enclosing said second electronic unit:
   a first connector operatively coupled to said first electronic unit enclosed in said first unit housing and movable externally of the first unit housing from a first predetermined position which is fixed relative to said first unit housing to a second predetermined position which is also fixed relative to the first unit housing;
   a second connector located outside said second unit housing, fastened to said second unit housing and operatively engagable with said first connector; and
   mechanical actuator means supporting said first connector for moving said first connector along a predetermined controlled path into operative engagement with said second connector wherein the controlled path links the first unit housing to the second unit housing in a substantially continuous fashion.

18. The multi-unit arrangement of claim 17 wherein said first unit housing is stacked flush to said second unit housing.

19. The multi-unit arrangement of claim 17 wherein said first and second unit housings respectively have first and second recessed portions, said first and second recessed portions forming an interconnect conduit when said first unit housing is aligned at a predetermined position relative to said second unit housing, said first and second recessed portions each having a cam face including cam surface means for guiding said first connector along said controlled path into engagement with said second connector.

20. An electronic unit that is connectable with a similar electronic unit positioned above it, the upper electronic unit having at least an upper connector movable relative to the upper electronic unit and a lever pivotally fastened to the upper electronic unit, the upper connector being mechanically coupled to and movable by the lever along a substantially arc-shaped path, the lower electronic unit comprising:
   a lower unit housing;
   a lower unit connector fastened to said lower unit housing and operatively engagable with said upper connector;
   guide means for guiding said upper connector at least partially along said substantially arc-shaped path and for directing said upper connector into straight engagement with said lower connector as the upper connector is moved by the lever; and
   locking means for receiving and retaining the pivoting lever fastened to the uper electronic unit to thereby mechanically secure the upper electronic unit to the lower unit housing in a substantially fixed manner.

21. An inter-unit coupling mechanism according to claim 1 wherein the controlled path is substantially arc-shaped.

22. An inter-unit coupling mechanism according to claim 1 wherein the first connector has a major axis along which the communication means is coupled thereto and the guide means urges the first connector such that its major axis remains substantially tangent to the controlled path.

23. An inter-unit coupling mechanism according to claim 1 wherein the guide means comprises a first cam portion, fixedly attached to the first enclosure, and a second cam portion, fixedly attached to the second enclosure, and wherein the first and second cam portions are adapted to join together and form a composite cam when the first and second enclosures are aligned in said predetermined relationship such that the movement of the first connector will be controlled by the composite cam.

24. An inter-unit coupling mechanism for coupling a first electronic unit housed in a first enclosure to a second electronic unit housed in a second enclosure when the first and second enclosures are fixed in a predetermined positional arrangement relative to one another, comprising:
   a first connector, which is movable relative to and externally of the first enclosure and is electrically coupled to the first electronic unit; and
   guide means for restricting the first connector to movement within a controlled pathway, the controlled pathway being an elongated course which has a pair of opposed, generally parallel, boundary lines defining outer limits of the pathway, where each of the boundary lines communicates between the first and second enclosures when said enclosures are fixed in said predetermined positional arrangement.

25. An inter-unit coupling mechanism according to claim 24 wherein said guide means includes a lever arm having an slot provided therein, the lever arm being pivotally mounted to the first enclosure; and
   wherein the first connector is linked to the lever arm such that the movement of the first connector is restricted by the dimensions of the slot.

26. An inter-unit coupling mechanism according to claim 24 further comprising:
   a second connector, which is electrically coupled to the second electronic unit and is operatively engageable with the first connector; and
   retaining means for holding the second connector within the outer limits of the controlled pathway so that the first connector can engage with the second connector;
   wherein the controlled pathway includes a linear portion for guiding the first connector into straight engagement with the second connector.

27. An inter-unit coupling mechanism according to claim 24 further comprising:
   lever arm means, pivotally mounted to said first enclosure, for carrying the first connector along the controlled pathway
   wherein the first connector is coupled to the first electronic unit by a flexible electrical coupling and is rotatably attached to the lever arm means, and wherein the guide means includes cam means for restricting rotation of the first connector relative to the first enclosure to thereby limit bending of the electrical coupling between the first connector and the first electronic unit.

28. An inter-unit coupling mechanism for coupling a first electronic unit housed in a first enclosure to a second electronic unit housed in a second enclosure when the first and second enclosures are in a predetermined positional arrangement relative to one another comprising:
   a first connector, which is movable relative to and externally of the first enclosure and is electrically coupled to the first electronic unit; and
   guide means for restricting the first connector to movement solely along a predetermined path, the predetermined path being one which joins the first and second enclosures in a substantially complete manner when the first and second enclosures are in said predetermined positional arrangement.

29. An inter-unit coupling mechanism according to claim 28 wherein the first and second enclosures are stacked together in said predetermined positional arrangement.

30. An inter-unit coupling mechanism according to claim 29 further comprising latching means for detachably securing the first and second enclosures to one another.

31. An inter-unit coupling mechanism according to claim 1 wherein the controlled path includes a nonlinear portion.

32. An inter-unit coupling system according to claim 1 wherein the first enclosure is adapted to be moved away from the second enclosure and the guide means includes movement restricting means, fastened to the first enclosure, for restricting the movement of the first connector to a predetermined course including the first and second positions even when the first enclosure is moved away from the predetermined relationship with the second enclosure.

* * * * *